United States Patent
Wynns

[19]

[11] Patent Number: 6,139,649
[45] Date of Patent: Oct. 31, 2000

[54] DIFFUSION METHOD FOR COATING HIGH TEMPERATURE NICKEL CHROMIUM ALLOY PRODUCTS

[75] Inventor: Kim A. Wynns, Spring, Tex.

[73] Assignee: Alon, Inc., Leechburg, Pa.

[21] Appl. No.: 09/255,596

[22] Filed: Feb. 22, 1999

Related U.S. Application Data

[63] Continuation-in-part of application No. 08/702,175, Aug. 23, 1996, Pat. No. 5,873,951.

[51] Int. Cl.$^7$ ........................................ C23C 8/80
[52] U.S. Cl. ........................ 148/277; 148/285; 148/519; 427/239; 427/255.7; 427/328
[58] Field of Search ................... 148/242, 277, 148/285, 519; 427/205, 239, 255.7, 328, 405

[56] References Cited

U.S. PATENT DOCUMENTS

| | | | |
|---|---|---|---|
| 3,365,327 | 1/1968 | Puyear | 117/107.3 |
| 4,004,047 | 1/1977 | Grisik | 427/142 |
| 4,904,501 | 2/1990 | Davis | 427/253 |
| 5,135,777 | 8/1992 | Davis et al. | 148/6.14 |

FOREIGN PATENT DOCUMENTS

| | | |
|---|---|---|
| 99 0427 | 10/1951 | France . |
| 80029151 | 8/1980 | Japan . |
| 501 117 A | 4/1976 | U.S.S.R. . |
| 287194 | 3/1928 | United Kingdom . |
| 1018628 | 1/1966 | United Kingdom . |

WO97/41275 11/1997 WIPO .

OTHER PUBLICATIONS

Reprint from Oil & Gas Journal, "Aluminized ethylene furnace tubes extend operating life," Reprinted from the Aug. 31, 1987 edition of Oil & Gas Journal, Copyright 1987 by PennWell Publishing Company.
"A Study Of The Results Of 3½ Years of Exposure Of Alonized Tubes In An Ethylene Pyrolysis Furnace," Nov., 1984.

*Primary Examiner*—John Sheehan
*Assistant Examiner*—Andrew L. Oltmans
*Attorney, Agent, or Firm*—Buchanan Ingersoll, P.C.

[57] ABSTRACT

The inner surface of a high temperature nickel chromium alloy product such as ethylene furnace tubes is cleaned with high temperature hydrogen to prepare the surface for the deposition, diffusion and modification of metals. A first layer of chromium or chromium and silicon is deposited and diffusion heat treated or covered by the second layer of aluminum, magnesium, silicon and manganese and third layer of rare earth metals such as yttrium and zirconium. Each layer or the combination of layers is diffusion heat treated at sufficient time and temperature to cause a diffusion depth ranging from 50 microns to 150 microns with a maximum of 250 microns. The surface is then heated to convert the immediate surface to a spinel and further pretreated with argon and nitrogen to stabilize the surface oxides. The surface of the final coating can be polished to minimize sites for carbon buildup. When ethylene is produced using furnace tubes which are coated in this manner less coking occurs.

16 Claims, 1 Drawing Sheet

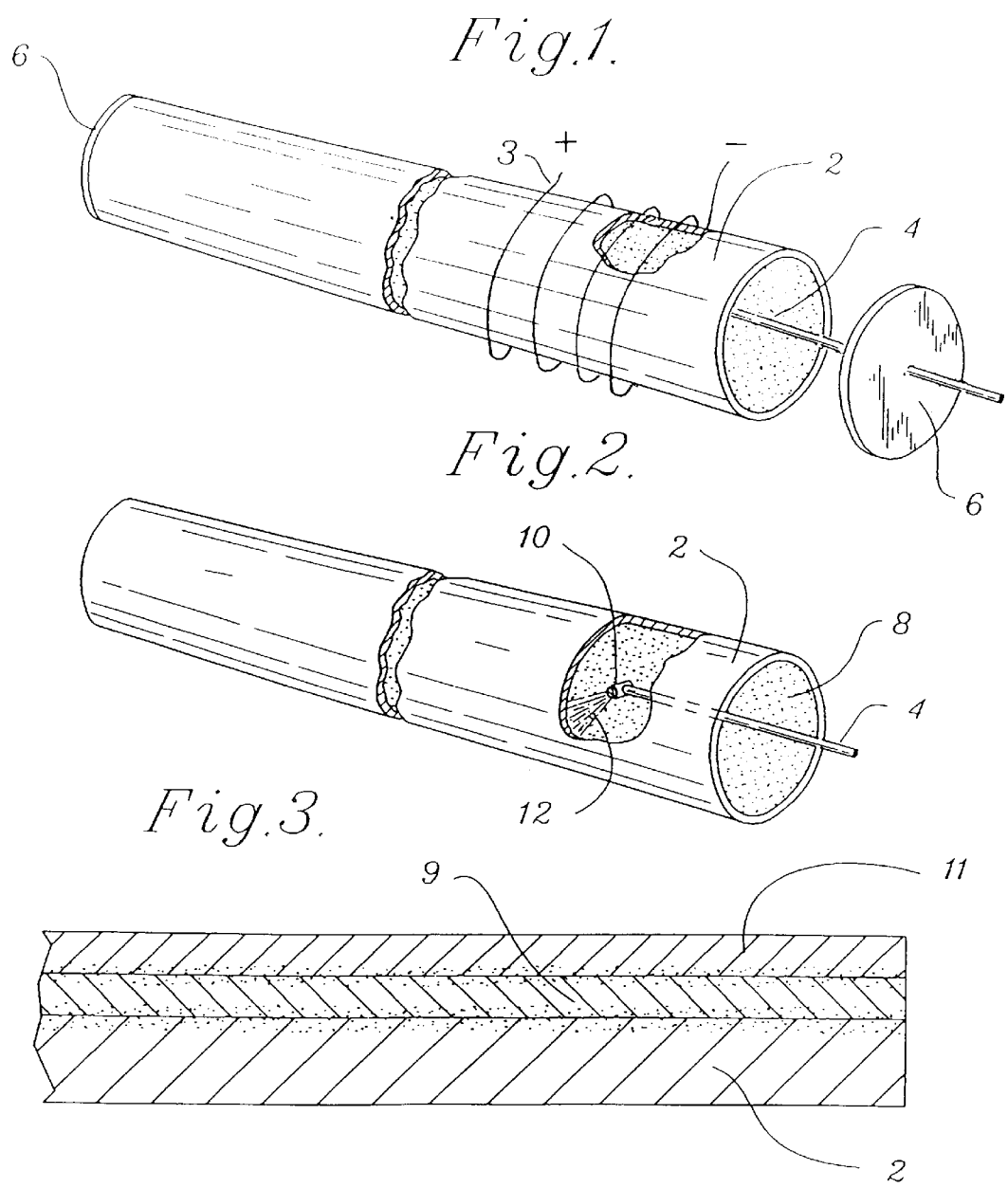

DIFFUSION METHOD FOR COATING HIGH TEMPERATURE NICKEL CHROMIUM ALLOY PRODUCTS

CROSS REFERENCE TO RELATED APPLICATION

This application is a continuation-in-part of U.S. patent application Ser. No. 08/702,175, filed Aug. 23, 1996, and issued on Feb. 23, 1999, as U.S. Pat. No. 5,873,951.

FIELD OF INVENTION

The invention relates to a complex mixture in combination or sequence of chromium, aluminum, silicon, titanium, magnesium, zirconium, manganese, yttrium metal atoms and oxides deposited and diffused system into the surface of superalloys and subsequent surface, post diffusion surface conversion to a spinel and pretreatment to provide improved resistance to carburization, catalytic surface reactions, coking, fouling and corrosion.

BACKGROUND OF THE INVENTION

Ethylene is produced by passing a feedstock containing naphtha, ethane, and other distillates through a furnace comprised of a series of tubes. To achieve desired creep strength, mechanical requirements, and oxidation resistance, these tubes are made of higher alloys such as the wrought Alloy 800 series, and centrifugally or static cast alloys such as HK, HP and HH alloys. The feedstock enters the furnace at a temperature of about 1000° F. where it is heated to about 1650° F. During the process pyrolytic coke is produced. Some of the coke accumulates on the walls of the furnace tubes. Nickel and iron in the tubes reacts with the coke to form long whisker-like structures that extend from the walls of the tubes called catalytic coke. These strands tend to catch pyrolytic coke passing through the tubes to form a complex amorphous coke layer on the inner wall of the furnace tubes. This amorphous coke layer acts as an insulator increasing the temperature of the inner walls in order to deliver adequate heat to the process stream to crack the feedstock. Consequently, the furnace must be periodically cleaned to remove this layer of coke. This cleaning is often called decoking. At many locations the tubes must be cleaned every 30 days.

The art has attempted to control catalytic coking by the selection of high chromium and nickel alloys with significant silicon content or by applying a chromium or aluminum or ceramic coating to the inner walls of the furnace tube. However, higher chromium coatings introduces instability in the alloy structures. Aluminum coatings have found limited success on wrought alloys with process temperatures not exceeding 1650°. At higher temperatures inter-diffusion and spalling can occur. Solid ceramic coatings suffer from cracking and spalling.

Coatings of two or more materials have also been proposed for metals used in high temperature process applications. In Japanese Patent 80029151 there is disclosed a method for applying a chromium-aluminum-silicon coating. This coating is produced by a chromium pack cementation process followed by an aluminum-silicon pack cementation process. The coated metal is said to be useful for jet engines, gas turbines and internal combustion engines. In U.S. Pat. No. 3,365,327 there is disclosed a method for vapor diffusion coating metallic articles with aluminum-chromium-silicon to provide elevated temperature corrosion resistance for gas turbine and oil refinery applications. The technique involves a slurry coating followed by high temperature firing. There is no teaching in any of these references that such coatings would be useful for ethylene furnace tubes.

Pack cementation is a well known technique for applying diffusion coatings such as U.S. Pat. No. 5,873,951 where it teaches the use of a two step process with an intermediate cleaning and post process polishing. This coating combination of chromium-silicon and aluminum-silicon has proven successful up to 1850° F. At temperatures exceeding 1850° F. metallic coating combinations are prone to phase changes and reduced resistance to carburization. Consequently, there is a need for an effective method of treating high alloy ethylene furnace tubes to reduce catalytic coking

SUMMARY OF THE INVENTION

I provide a method of coating the inner surface of ethylene furnace tubes not limited in length and other high temperature nickel chromium alloy products in which I deposit via physical vapor deposition, also called PVD, a sufficient amount of chromium, chromium-silicon, chromium-magnesium, or multiple combinations thereof. The inside surface of the tube is first prepared by cleaning to remove all rust, corrosion products, scale and loose debris in preparation for exposing the surface to high temperature hydrogen to condition the surface for the metal(s) deposition via PVD. The initial metal barrier is deposited in a single step or is followed by subsequent metal layers of similar or different metals via an emitter. This initial metal barrier is either diffusion heat treated in situ or is layered with subsequent intermediate PVD deposited chemistries such as silicon, aluminum, magnesium, manganese and titanium. The last layer consists of rare earth metals or metals such as yttrium or zirconium which form oxide stabilizers. The initial barrier layer and subsequent layers are diffusion heat treated into the wrought or cast super alloys, such as HP, HK, Alloy 800, or special alloys such as 353MA. Since the diffusion heat treatment step can be done after the deposition of each layer or intermediately after all layers have been deposited, the diffusion thickness varies from 10 microns to 150 microns with resultant maximum targeted for 250 microns. Once the layers have been diffusion heat treated, the near surface is further converted to a cermet or ceramic via heating the surface in an atmosphere consisting of a combination of argon, nitrogen, helium, and/or oxygen. The PVD transport method can utilize solid master alloys, sintered powder, powder, inserts, slurry, or ceramic cartridge. This method results in a slightly rougher surface than base material tubular. Post process polishing is an option but not entirely necessary.

BRIEF DESCRIPTION OF THE FIGURES

FIG. 1 is a perspective view partially cut away of a furnace tube containing an emitter for applying a first coating via PVD in accordance with a first preferred embodiment;

FIG. 2 is a cross sectional view of a portion of a furnace tube to which my coating has been applied; and FIG. 3 is a perspective view showing the general arrangement of the coating layers in the wall cross section of a furnace tube.

DESCRIPTION OF THE PREFERRED EMBODIMENTS

I provide improved method for diffusion coating high temperature nickel-chromium alloy products, particularly ethylene furnace tubes and pipes, which will reduce pyrolytic coking on the surface of the coated products and reduce decoking times in ethylene furnaces. The coating is applied to those surfaces which are exposed to ethylene. Furnace tubes and pipes are provided with a diffusion coating on their inner wall. The diffusion coating is applied in one step or multiple steps. Shown in FIG. 1 is a furnace tube or pipe 2 which can be of any desired length and may include both straight portions and return bends. The inside of the tube is filled with a PVD target 4 with a designed metal system or initial chromium based barrier metal and sealed with caps on both ends. Caps 6 are welded or sealed on either end of the tube. The capped tube is then put under a vacuum and purged with argon. The PVD generator is then engaged to supply the desired elements within the tube. The desired elements are deposited on the surface of the tube wall. Once the metals are deposited on the tube walls the tube wall is heated with conventional heating elements, such as heating device 3, gas fired or heated by electrical resistance or induction heating to a temperature high enough to diffuse the elements into the inside tube wall. The first diffusion layer thickness depth should result in a range of 10 microns to 150 microns with a desired maximum diffusion depth of 250 microns. Since physical vapor deposition is well known in the art, those skilled in the art will recognize that apparatus different from that shown in the drawing could be used.

After the diffusion coating is completed, then the inside surface is again cleaned with hydrogen at elevated temperatures to prepare the surface for the conversion process. Once the surface has been cleaned with high temperature hydrogen, then argon, nitrogen, helium and/or oxygen is again introduced into the tube and a vacuum is put on the inside surface. Cleaning can be done at temperatures between 1600° F. (871° C.) and 2000° F. (1204° C.). The inside is heated to a sufficient temperature to convert the aluminum and magnesium and titanium to a ceramic like spinel ($MgAl_2O_4$) but focused only on the inside surface so as not as to overheat the base material. I have found that temperatures ranging from 2200° (1204° C.) to 2800° F. (1538° C.) are sufficient depending upon the coating material. Once this is converted and formed at least 2 microns thick on the surface then the immediate surface is pretreated to form the most solid oxide available utilizing the PVD vacuum system and gas design capabilities. This pretreatment is the combination of a gas mixture of nitrogen, argon, helium and/or oxygen at elevated temperature in excess of 1205° C. (2200° F.). The final surface of the ID may be polished following the last pretreatment step to minimize nucleation sites for coke deposition. Welding together of the tubes is accomplished using special bevel preparation and typical weld wire and purge techniques historically used for ethylene furnace tube fabrication. I have found that ethylene furnace tubes coated in accordance with the present invention have significantly less catalytic coking.

For purposes of illustration in FIG. 3 I show multiple layers 9 and 11 of non-uniform thickness. It will be understood by those skilled in the art that some diffusion will occur between layers to create a strong bond.

I have used this method to coat tubes. For the first stage coating, I created a chromium diffusion coating of about 2 mils thickness on cleaned and high temperature hydrogen prepared HP-40 Nb (Niobium) modified cast alloy tubes using a master alloy for the PVD target. This configuration of master alloy consisted of three layers of chromium and silicon; then, aluminum, silicon and magnesium; and the last layer was titanium and silicon. The master alloy was placed in the tubes, which were sealed on both ends to make their own retort, deposited via PVD and heated at 1204° C. (2200° F.) for 10 hours under an inert argon atmosphere. The tubes surfaces were then cleaned with a 50–50% hydrogen-argon mixture at an elevated temperature of 1010° C. (1850° F.) for fifteen minutes. The inside of the tube then was filled with an argon-helium mixture and heated to 1315° C. (2400° F.) for one hour to form the spinel. Upon completion of the last step to form the spinel, the surface was further heated in an argon-nitrogen atmosphere at 1010° C. (1850° F.) for one hour to complete the surface pretreatment.

This process yields a coating ranging from 10 microns to 150 microns with the spinel thickness of 2 microns to 10 microns. Evaluation of a this coating system on HP-40 Nb modified cast alloy tube revealed an average coating thickness of 170 microns as determined by optical microscopy. The nominal base alloy composition was reached at a depth of 250 microns below the coating surface.

Thermal cycling experiments and coking studies were conducted on the coating system on HP-40 Nb modified tubes. These experiments involved heating in an air atmosphere furnace from room temperature to 1100° C. (2012° F.) at a rate of 9° F./minute, holding at 1100° F. for two hours, and then cooling down overnight by switching off the furnace. A total of 60 cycles were conducted.

The samples were weighed initially and after about every five cycles, and also at the end of the testing. They were also visually examined for signs of flaking, discoloration, spalling, etc. Small sections from as-coated and thermally cycled test specimens were examined with optical and scanning electron microscopes.

No spalling or internal oxidation of the coating system on the HP-40 Nb modified substrate occurred, which often occurs when only aluminum or aluminum-silicon is diffused and is subjected to severe thermal cycling. The integrity of the coating system was exceptional. Some interdiffusion (continued diffusion) of the lower coating elements occurred. After the 60 thermal cycles, the diffusion zone thickness was increased by 5 to 10 percent, however the spinel layer remained intact and did not change.

The present method is useful for both cast and wrought furnace tubes and pipes. Tests revealed that ethylene furnace tubes coated in accordance with the present method resist catalytic coking better than other coated tubes currently in use. I attribute this performance to the fact that my coating and process for applying the coating produces a cermet like surface pretreated to establish a barrier for carbon diffusion into the base material.

While I have described and illustrated certain present preferred embodiments of my methods for diffusion coating ethylene furnace tubes and other nickel chromium products, it should be distinctly understood that my invention is not limited thereto, but may be variously embodied within the scope of following claims.

I claim:

1. A method of coating a surface of a metal product formed from a nickel chromium alloy comprising:
   a. exposing the surface to hydrogen at elevated temperatures to remove diffusion limiting oxides and form a prepared surface;
   b. diffusing a sufficient amount of at least one metal selected from the group consisting of chromium, silicon, aluminum, magnesium, zirconium, manganese and titanium onto the prepared surface to form a coating having a thickness of at least 50 microns;
   c. heating a surface of the coating to a sufficient temperature to form a spinel at the surface of the coating; and d. treating the surface of the coating which has been heated with at least one gas selected from the group consisting of argon, nitrogen, helium and oxygen at a sufficiently high temperature to form stable oxides.

2. The method of claim 1 also comprising polishing the coating after treating the surface to minimize sites where carbon can collect.

3. The method of claim 1 wherein the coating has a thickness of at least 150 microns.

4. The method of claim 1 also comprising the step of diffusing rare earth elements onto the coating prior to heating to form oxide stabilizers in the coating.

5. The method of claim 4 wherein the rare earth elements are at least one of yttrium and zirconium.

6. The method of claim 1 also comprising the step of treating the surface with oxygen-nitrogen mix gas phase after heating and formation of the spinel.

7. The method of claim 1 wherein the at least one metal is diffused in at least two sequentially deposited layers and at least one such layer is applied by a surface physical vapor deposition process.

8. The method of claim 7 also comprising heating an exposed surface of at least one of the layers during the diffusion step.

9. The method of claim 8 wherein the heating is done at a temperature of from 1600° F. to 2000° F.

10. The method of claim 1 wherein the at least one metal is diffused in at least two separately deposited layers and each layer is applied from a master alloy emitter manufactured with metal layers physically layered on a carrier.

11. The method of claim 1 wherein the surface is an inner wall of a tube and the diffusion step applies at least three deposit layers, at least one of the three deposit layers being applied by:
  a. providing a target emitter containing at least three emitter layers;
  b. closing both ends of the tube;
  c. preparing the surface first with a hydrogen rich gas at elevated temperature;
  d. depositing each deposit layer with a PVD generator;
  e. heating the tube to an elevated temperature for a sufficient time to create a diffusion coating on the inner wall; and
  f. heating the inner wall of the tube with a vapor of argon and nitrogen of a temperature between 1600° F. and 2000° F.

12. The method of claim 1 wherein the surface is an inner wall of a tube and the diffusion step applies at least three deposit layers one of the three deposit layers being applied by:
  a. placing in the tube an insert formed from a ceramic composite containing a filler, a binder and at least one material selected from the group consisting of aluminum, chromium, magnesium, titanium and silicon;
  b. sealing both ends of the tube;
  c. placing the tube under a vacuum;
  d. exposing the inner wall of the tube to high temperature hydrogen;
  e. depositing onto the inner wall of the tube at least one material using physical vapor deposition;
  f. heating the tube to an elevated temperature for a sufficient time to create a diffusion coating on the inner wall; and
  g. depositing onto the diffusion coating at least one of zirconium and a rare earth metal to form oxide stabilizers.

13. The method of claim 12 wherein the rare earth metal is yttrium.

14. The method of claim 1 wherein the heating step is done at a temperature between 2200° F. and 2800° F.

15. The method of claim 1 wherein the treating step is performed at a temperature between 1600° F. and 2000° F.

16. The method of claim 1 wherein the metal product is an ethylene furnace tube.

* * * * *